(12) United States Patent
Daoud et al.

(10) Patent No.: US 6,781,851 B2
(45) Date of Patent: Aug. 24, 2004

(54) ELECTROMAGNETIC INTERFERENCE SHIELD

(75) Inventors: Bassel H. Daoud, Parsippany, NJ (US); Ivan Pawlenko, Holland, PA (US); Larry Samson, Langhorne, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/158,709

(22) Filed: May 30, 2002

(65) Prior Publication Data

US 2003/0223213 A1 Dec. 4, 2003

(51) Int. Cl.[7] ................................................. H05K 9/00
(52) U.S. Cl. ....................... 361/818; 361/816; 361/800; 174/51 R; 174/35; 428/550
(58) Field of Search ..................... 361/818, 816, 361/800, 752, 683; 174/35, 51 R, 35 GC, 35 MS; 428/550, 547, 553, 613

(56) References Cited

U.S. PATENT DOCUMENTS

| | | | | |
|---|---|---|---|---|
| 2,219,941 A | * | 10/1940 | Rochow | ................. 174/35 MS |
| 4,218,578 A | * | 8/1980 | Olschewski et al. | ...... 174/35 R |
| 4,838,475 A | * | 6/1989 | Mullins et al. | .......... 228/179.1 |
| 5,028,739 A | * | 7/1991 | Keyser et al. | ......... 174/35 GC |
| 5,644,472 A | * | 7/1997 | Klein | ......................... 361/695 |
| 5,847,938 A | | 12/1998 | Gammon | .................... 361/816 |
| 6,157,546 A | | 12/2000 | Petty et al. | ................. 361/816 |
| 6,239,359 B1 | | 5/2001 | Lilienthal, II et al. | .. 174/35 GC |
| 6,269,008 B1 | * | 7/2001 | Hsu | ........................... 361/816 |
| 6,288,329 B1 | * | 9/2001 | Kopp et al. | ............... 174/35 R |
| 6,347,035 B1 | | 2/2002 | Hamano et al. | ............ 361/687 |

* cited by examiner

Primary Examiner—Randy W. Gibson
Assistant Examiner—Hung S. Bui

(57) ABSTRACT

An electromagnetic interference shield comprises a non-rigid porous metallic material and a conforming element. The non-rigid porous metallic material is shaped by the conforming element to have a top and sidewalls extending downward from the top. The shaped porous metallic material defines a cavity for receiving at least one circuit component therein.

25 Claims, 3 Drawing Sheets

ELECTROMAGNETIC INTERFERENCE SHIELD

BACKGROUND OF THE INVENTION

1. Field of the Invention

The present invention generally relates to electromagnetic interference shield devices and, more particularly, to an electromagnetic interference shield for shielding circuit components and/or circuitry within electronic devices.

2. Description of the Related Art

In various electronics applications, electronic components must be protected from electromagnetic radiation and interference. Various types of electronics, such as cellular phones, computers, receivers, and transmitters, have components that emit, or require shielding from, electromagnetic interference (EMI). Susceptible components are generally shielded to protect against EMI generated by, other components, as well as from the environment surrounding the device.

To alleviate the foregoing problems, manufacturers have used what are commonly referred to as "can" shields. Can shields are typically formed of solid sheet metal and are mounted on circuit boards to electromagnetically isolate circuit components from one another. In some instances, the circuit components generate heat, which can be exacerbated by the placement of the can shield over the circuit components. To dissipate this heat, heatsinks, solid copper, and/or springs can be attached to both the circuit components and the can shield, for transmitting heat from the circuit components to the can shield by convection. Such heatsink devices increase the overall cost and weight of the circuit board.

SUMMARY OF THE INVENTION

The present invention is an electromagnetic interference shield for shielding circuit components from electromagnetic or radio frequency interference. In accordance with the present invention, the electromagnetic interference shield comprises a non-rigid porous metallic material and a conforming element. The non-rigid porous metallic material is shaped by the conforming element to have a top and sidewalls extending downward from the top. The shaped porous metallic material defines a cavity for receiving at least one circuit component therein. In one embodiment, the conforming element comprises a perforated cover constructed from perforated sheet metal. The present invention advantageously dissipates heat by allowing air to circulate through the porous metallic material. In addition, the present invention exhibits less overall weight, and is less costly to manufacture, than the solid metal can shield having heatsinks attached to the shielded components.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The present invention is an EMI shield for shielding circuit components. The present invention has applications in telecommunications, such as in cabinets having numerous "circuit packs" disposed in closely packed, side-by-side relation on grooved shelves. The present invention also has applications in other systems and in smaller electronic devices, such as mobile phones, where minimal overall weight of the electronic device is desired. Those skilled in the art, however, will appreciate that the present invention can be advantageously employed in any circuit board having circuit components that require electromagnetic and/or radio frequency shielding.

Figure 1:
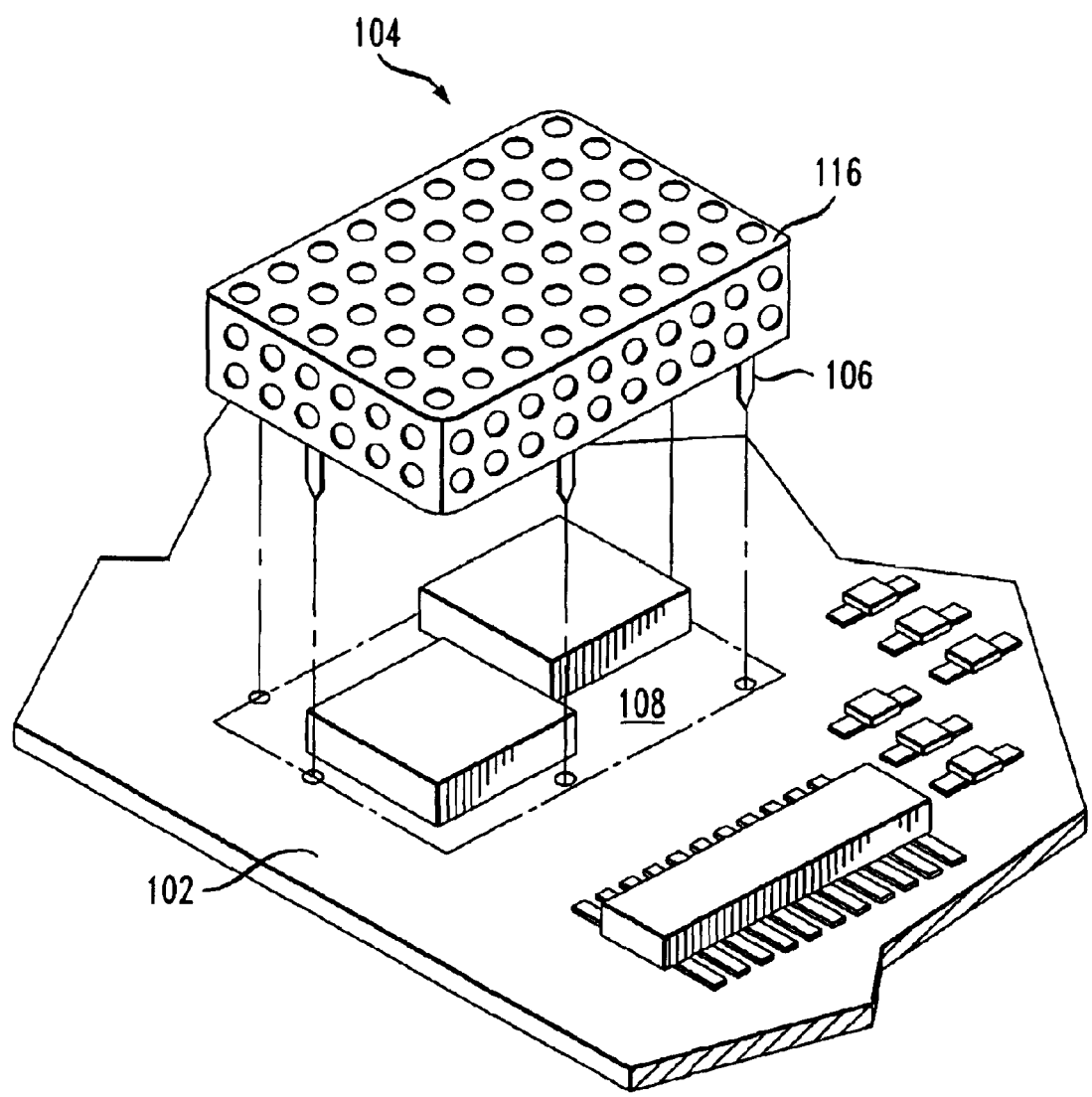
FIG. 1 is a view, in perspective and exploded, of an EMI shield in accordance with the present invention for being mounted on a circuit board.
Figure 2:
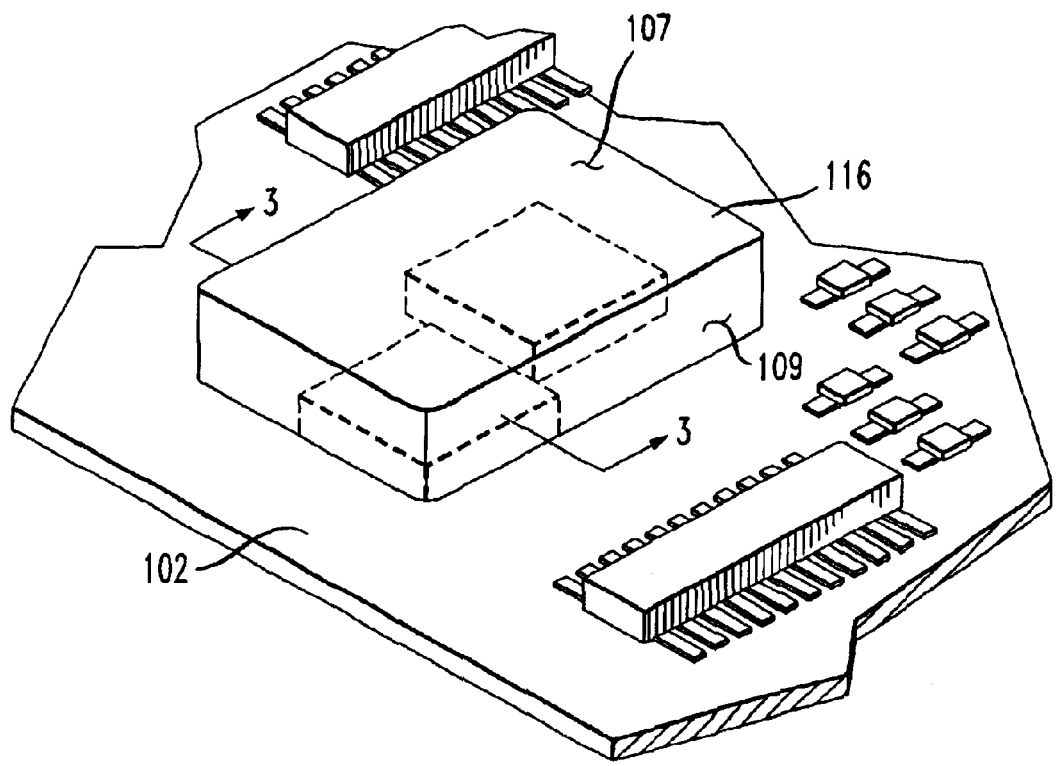
FIG. 2 is a view similar to FIG. 1, but with the EMI shield of the present invention mounted on the circuit board.

FIG. 1 shows a portion of an illustrative circuit board 102 having mounted thereon a number of circuit components, as well as an EMI shield 104 in accordance with the present invention. The circuit board 102 comprises, for example, a rigid board of a dielectric material having a pattern of electrically conductive areas or "traces" that are "printed" on one or more or layers of the board. Various electronic and/or optical components are physically mounted on the circuit board 102 and electrically interconnected via the conductive surface areas. For example, the circuit board can comprise a printed circuit board (PCB) or a printed wiring board (PWB). The EMI shield 104 is mechanically and electrically secured to the circuit board 102 for defining an EMI shielded space 108 surrounding one or more circuit components mounted on the circuit board 102. FIG. 2 shows the EMI shield 104 mounted to the circuit board 102.

Figure 3:
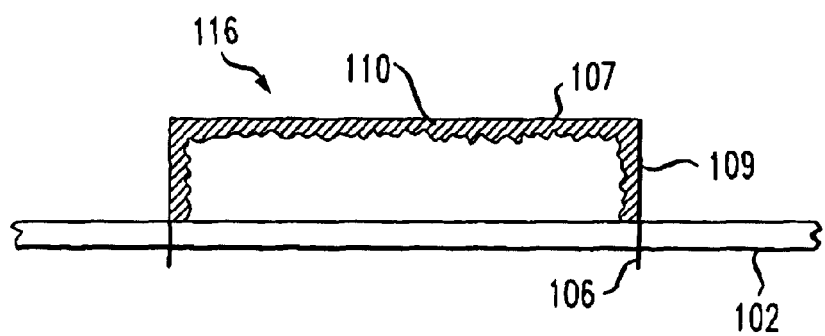
FIG. 3 is a cross-sectional view of the EMI shield of FIG. 2.

The description of the present invention can be best understood with simultaneous reference to FIGS. 1–3. FIG. 3 is a cross-sectional view of the EMI shield 104 taken along the section line 3—3 shown in FIG. 2. In accordance with one embodiment of the present invention, the EMI shield 104 comprises a non-rigid porous metallic material 110 (also referred to herein as porous metallic material) and a conforming element 116. In the embodiment shown, the conforming element 116 comprises a perforated cover constructed from perforated sheet metal (FIG. 1). Alternatively, the conforming element 116 can comprise a perforated cover formed of molded nonconductive material having an electrically conductive coating (e.g., metallized plastic).

Any such metallic materials can be used with the EMI shield 104, but the preferred materials are known ductile metals, for example, stainless steel, brass, copper, and the like, workable by known procedures, such as stamping (and bending), deep drawing, and photo-etching. For example, the conforming element 116 can be stamped from perforated stainless steel sheet metal. The thickness of conforming element 116 is dependent upon the size of the EMI shield 104. The illustrative thickness can range from 0.001 to 0.032 inch. Other thicknesses can be used, depending upon the type of EMI that is to be contained.

In the present embodiment, the conforming element 116 generally has the shape of a box with one missing or open side. That is, the conforming element 116 comprises a top 107 and sidewalls 109 extending downward from the top 107. Although the conforming element 116 is shown as a substantially rectangular cover, the conforming element 116 can have any geometric shape, including generally circular shape or a polygonal shape. The porous metallic material 110 is mounted to the top 107 and the sidewalls 109. The conforming element 116 shapes the non-rigid porous metallic material 110 to define a cavity for receiving at least one circuit component therein, and is adapted to cause the porous metallic material 110 to retain its shape. The porous metallic material 110 electrically cooperates with a ground plane of the circuit board 102 to reduce EMI generated by at least one circuit component disposed therebetween. Heat generated by the shielded circuit components will dissipate through the "pores" in the porous metallic material 110, and through the perforations in the conforming element 116. Heat can be further dissipated by the use of cooling fans for circulating air through the porous metallic material 110 and the conforming element 116.

The porous metallic material 110 can be a unitary piece or a plurality of separate pieces. The portion of the porous metallic material 110 mounted to the top 107 has a length and width in accordance with the dimensions of the top 107. Likewise, the portion of the porous metallic material 110 mounted to the sidewalls 109 has a length and width in accordance with the dimensions of the sidewalls 109. The porous metallic material 110 can be mounted to the inside of the conforming element 116 (i.e., the sides of the top 107 and sidewalls 109 opposing the circuit element) using adhesives, mounting tabs extending from the conforming element 116, staples, or like type fastening devices known to those skilled in the art. Those skilled in the art will appreciate that the porous metallic material 110 can be mounted to the outside of the conforming element 116 rather than, or in addition to, the inside of the conforming element 116.

Figure 4:
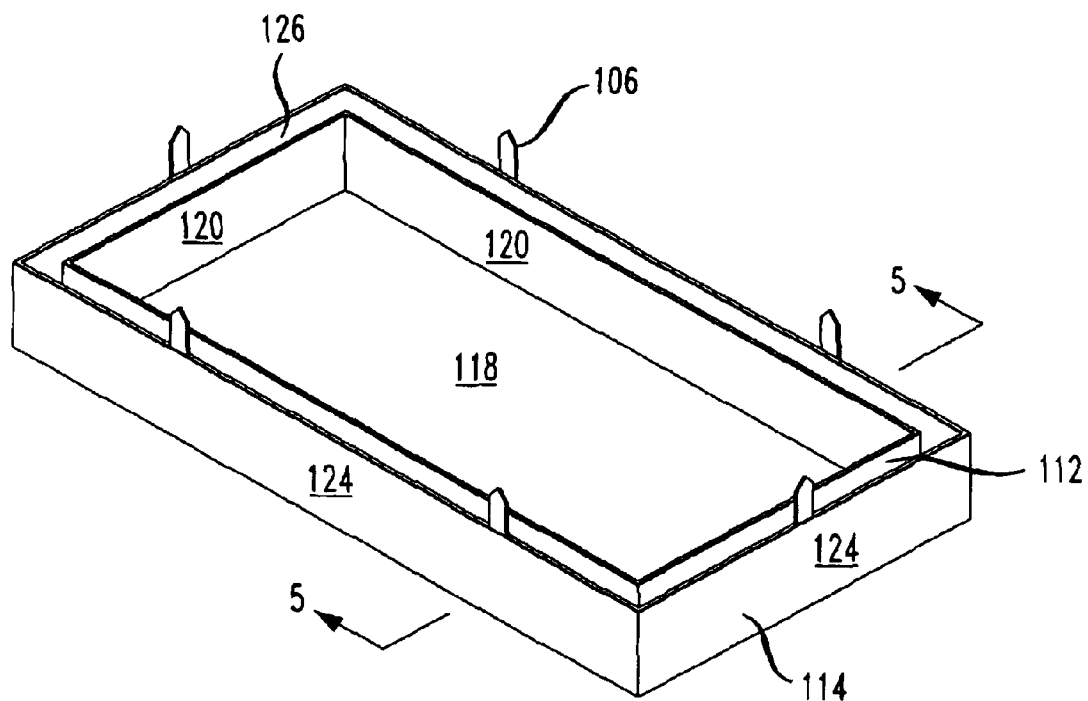
FIG. 4 is a perspective view of the bottom of another embodiment of the inventive EMI shield.
Figure 5:
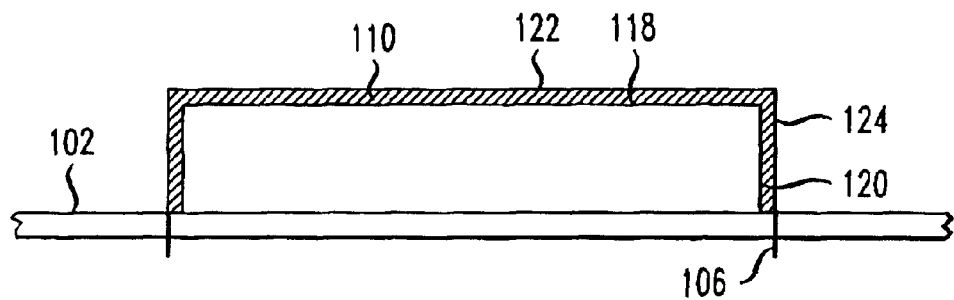
FIG. 5 is a cross-sectional view of the EMI shield of FIG. 4.

FIG. 4 is a perspective view of the bottom of another embodiment of the conforming element 116. FIG. 5 is a cross-sectional view of the EMI shield 104 constructed in accordance with the embodiment shown in FIG. 4, taken along the section line 5—5. In the present embodiment, the EMI shield 104 comprises a porous metallic material 110 disposed between an inner portion 112, and an outer portion 114, of the conforming element 116. The inner portion 112 has an inner top 118 with inner walls 120 extending from the inner top 118 at generally orthogonal angles thereto. Likewise, the outer portion 114 has an outer top 122 with outer walls 124 extending from the outer top 122 at generally orthogonal angles thereto. The inner and/or outer walls 120 and 124 can be welded, bonded, fastened, soldered, or otherwise attached to the inner and outer tops 118 and 122, respectively. Alternatively, the inner and outer walls 120 and 124 can be integrally formed with the inner and outer tops 118 and 122. The thickness of the inner and outer walls 120 and 124, as well as the inner and outer tops 118 and 120, is dependent upon the size of the EMI shield 104. The illustrative thickness can range from 0.001 to 0.032 inch. Other thicknesses can be used, depending upon the type of EMI that is to be contained.

The inner portion 112 is disposed relative to the outer portion 114 such that a gap 126 is formed between the inner and outer tops 118 and 122 and the inner and outer walls 120 and 124 (FIG. 5). The gap 126 has clearance selected to provide adequate room for the porous metallic material 110, which is disposed therein. The inner portion 112 and the outer portion 114 can be formed or cast as a unitary body. For example, the inner and outer tops 118 and 122 and the inner and outer walls 120 and 124 are formed from a single piece of sheet metal or metallized plastic by stamping.

Alternatively, the inner portion 112 can be formed separately from the outer portion 114, and the inner portion 112 can then be secured to the outer portion 114. For example, the inner portion 112 and the outer portion 114 can be separately stamped, the porous metallic material 110 placed therebetween, and the inner and outer portions 112 and 114 folded to produce the perforated cover 116. Tabs (not shown) can be formed on one of the inner and outer portions 112 and 114, which can be inserted through slots (not shown) formed in the other of the inner and outer portions 112 and 114 to secure the two portions 112 and 114 together.

Again, the porous metallic material 110 can be a unitary piece or a plurality of separate pieces. The portion of the porous metallic material 110 between the inner and outer tops 118 and 122 has a length and width in accordance with the internal dimensions of the portion of the gap between inner and outer tops 118 and 122. Likewise, the portion of the porous metallic material 110 between the inner and outer walls 120 and 124 has a length and width in accordance with the internal dimensions of the portion of the gap between the inner and outer walls 120 and 124. As with the previous embodiment, the conforming element 116 shapes the non-rigid porous metallic material 110 to define a cavity for receiving at least one circuit component therein, and is adapted to cause the porous metallic material 110 to retain its shape. The porous metallic material 110 electrically cooperates with a ground plane of the circuit board 102 to reduce EMI generated by at least one circuit component disposed therebetween.

In yet another embodiment, the conforming element 116 can comprise a plurality of rigid elements for shaping the non-rigid porous metallic material 110 to define a cavity configured to receive at least one circuit component therein. For example, each rigid element can comprise a wire formed from known ductile metals and workable by known procedures (e.g., bending). The plurality of wires can be inserted through the porous metallic material and shaped to collectively form a box with one missing or open side, as described above with respect to FIGS. 1 and 2. That is, the wires collectively form a top and sidewalls extending downward from the top. The wires extend through the porous metallic material 110 and retain the shape thereof.

The term "porous metallic material" as used herein means any porous metallic, conductive, or non-conductive metallized material (e.g., metallized plastic), including, but not limited to, metallic wool, metallic foam, metallic sponge, cellular metal, wire mesh, and like type materials known to those skilled in the art. In one embodiment, the porous metallic material 110 comprises a multiplicity of continuous strands of metal fiber woven together in a web or roving (e.g., metallic wool). In another embodiment, the porous metallic material 110 comprises a mesh of metal fibers (e.g., wire mesh). The average width of the strands or metal fibers can range from 2 microns (e.g., fine grade metallic wool) to 150 microns (e.g., coarse grade metallic wool). The density of the web or mesh can range from 2% metallic material to over 70% metallic material. The porous metallic material 110 can comprise, for example, stainless steel, copper, bronze, brass, aluminum, or other alloys. Such metallic wool and wire mesh is commercially available from Global Material Technologies, Inc., located in Palatine, Ill., or from American Steel Wool Company, located in Long Island City, N.Y.

As described above, the porous metallic material 110 employed within the context of the present invention operates to reduce and/or suppress conducted and radiated EMI. The extent to which such conducted or radiated EMI is attenuated or suppressed relates to the density of the material, the thickness of the material (i.e., strand thickness and bulk thickness), as well as other factors. As known to those skilled in the art, the conductivity of the material itself, as well as related functions (e.g., skin effect), contribute to such attenuation or suppression. As will be appreciated by those skilled in the art informed by the teachings of the present invention, alternate porous metallic materials, alternate conductive materials (and semiconductor materials), and other modifications may be made, such modifications being contemplated by the inventors in accordance with the teachings and goals of the present invention.

The EMI shield 104 includes fasteners 106 extending from the conforming element 116 that can be inserted into corresponding holes in the circuit board 102. The EMI shield 104 can be attached to the circuit board 102 by soldering the fasteners 106 to one or more of the holes in the printed circuit board 102. For example, the EMI shield 104 can be electrically connected to a ground plane of the circuit board 102 by soldering the fasteners 106 to the ground plane. In an alternative embodiment, the EMI shield 104 includes surface-mounting pads orthogonally extending therefrom. For example, such surface-mounting pads can be formed by bending fasteners 106 at approximate right angles to the sidewalls of the conforming element 116. The surface-mounting tabs are arranged to electrically, and mechanically, connect the EMI shield 104 to metallic traces of the circuit board 102 in accordance with known surface mounting procedures.

The EMI shield 104 can be made to virtually any dimensions. Thus the EMI shield 104 of the present invention can accommodate small circuit components, such as these employed in hand-held mobile phones, for example, as well as large circuit components, such as those employed in high-powered amplifiers, for example. In addition, the EMI shield 104 of the present invention can obviate the need to provide a heatsink for the dissipation of heat. The present invention advantageously employs the porous metallic material 110 to dissipate heat. Heat generated by the circuit components will dissipate through the "pores" in the metallic material 110. Heat can be further dissipated by the use of cooling fans for circulating air through the porous metallic material 110. The inventive EMI shield 104 provides a shielding device that has less mass than current EMI shield, which are formed of solid metal and typically require heatsinks. Thus, in cases where an electronic assembly requires a high number of EMI shields, the present invention has the advantage less overall weight when compared to EMI shields having a solid metal construction.

While the foregoing is directed to the preferred embodiment of the present invention, other and further embodiments of the invention may be devised without departing from the basic scope thereof, and the scope thereof is determined by the claims that follow.

What is claimed is:

1. A porous electromagnetic interference (EMI) shield, comprising:
   a non-rigid porous metallic material shaped to have a top and sidewalls extending downward from the top, the shaped porous metallic material defining a cavity for receiving at least one circuit component; and
   a conforming element adapted to cause said non-rigid porous metallic material to retain said shape to define said porous EMI shield.

2. The EMI shield of claim 1, wherein the non-rigid porous metallic material comprises a multiplicity of woven metallic strands.

3. The EMI shield of claim 2, wherein each of the multiplicity of woven metallic strands has a width between 2 and 150 $\mu$m.

4. The EMI shield of claim 2, wherein the non-rigid porous metallic material has an approximate density between 2% metallic material to 70% metallic material.

5. The EMI shield of claim 2, wherein the multiplicity of woven metallic strands are formed into metallic wool.

6. The EMI shield of claim 2, wherein the metallic strands comprise metal selected from the group of steel, copper, bronze, brass, and aluminum.

7. The EMI shield of claim 2, wherein the non-rigid porous metallic material comprises a nonconductive material having a conductive coating.

8. The EMI shield of claim 1, wherein the conforming element comprises a perforated cover, the non-rigid porous metallic material being mounted to the perforated cover.

9. The EMI shield of claim 1, wherein the conforming element comprises a plurality of rigid elements extending through the porous metallic material.

10. The EMI shield of claim 1, wherein said porous metallic material electrically cooperates with a ground plane of a circuit board to reduce EMI generated by at least one circuit component disposed therebetween.

11. An electromagnetic interference (EMI) shield, comprising:
    a perforated cover having a top and sidewalls extending downward from the top, the perforated cover defining a cavity for receiving at least one circuit component; and
    a non-rigid porous metallic material mounted to the top and the sidewalls of the perforated cover.

12. The EMI shield of claim 11, wherein the perforated cover comprises metal.

13. The EMI shield of claim 11, wherein the perforated cover comprises a nonconductive material having a conductive coating.

14. The EMI shield of claim 11, wherein the non-rigid porous metallic material comprises a multiplicity of woven metallic strands.

15. The EMI shield of claim 14, wherein each of the multiplicity of woven metallic strands has a width between 2 and 150 $\mu$m.

16. The EMI shield of claim 14, wherein the non-rigid porous metallic material has an approximate density between 2% metallic material to 70% metallic material.

17. The EMI shield of claim 14, wherein the multiplicity of woven metallic strands are formed into metallic wool.

18. The EMI shield of claim 14, wherein the metallic strands comprise metal selected from the group of steel, copper, bronze, brass, and aluminum.

19. The EMI shield of claim 11, wherein the non-rigid porous metallic material comprises a nonconductive material having a conductive coating.

20. The EMI shield of claim 11, wherein the perforated cover further comprises:

a plurality of fasteners for securing the perforated cover to a circuit board.

21. The EMI shield of claim 20, wherein the plurality of fasteners are configured to be inserted through holes in a circuit board.

22. The EMI shield of claim 20, wherein the plurality of fasteners are configured to be surface-mounted to a circuit board.

23. The EMI shield of claim 11, wherein the perforated cover further comprises:

an inner top spaced apart from the top; and
inner sidewalls spaced apart from the sidewalls;
wherein the non-rigid porous metallic material is disposed between the top and the inner top, and disposed between the sidewalls and the inner sidewalls.

24. The EMI shield of claim 23, wherein the top, sidewalls, inner top, and inner sidewalls are cast as a unitary body.

25. The EMI shield of claim 23, wherein the inner top and inner walls form an inner portion of the perforated cover, and the top and the sidewalls form a outer portion of the perforated cover, the inner portion being secured to the outer portion.

* * * * *